(12) United States Patent
Shoemake et al.

(10) Patent No.: US 8,957,941 B2
(45) Date of Patent: Feb. 17, 2015

(54) ENHANCED POWER SUPPLY

(71) Applicant: Biscotti Inc., McKinney, TX (US)

(72) Inventors: Matthew B. Shoemake, Allen, TX (US); Syed Nadeem Ahmed, Allen, TX (US)

(73) Assignee: Biscotti Inc., McKinney, TX (US)

(*) Notice: Subject to any disclaimer, the term of this patent is extended or adjusted under 35 U.S.C. 154(b) by 103 days.

(21) Appl. No.: 13/857,736

(22) Filed: Apr. 5, 2013

(65) Prior Publication Data
US 2013/0265384 A1  Oct. 10, 2013

Related U.S. Application Data

(60) Provisional application No. 61/620,900, filed on Apr. 5, 2012.

(51) Int. Cl.
| | |
|---|---|
| *H04N 7/15* | (2006.01) |
| *H05K 7/00* | (2006.01) |
| *H04B 3/56* | (2006.01) |
| *H04N 7/10* | (2006.01) |
| *H04N 7/14* | (2006.01) |
| *H01R 13/66* | (2006.01) |
| *H01R 31/02* | (2006.01) |

(52) U.S. Cl.
CPC .. *H04N 7/15* (2013.01); *H05K 7/00* (2013.01); *H04B 3/56* (2013.01); *H04N 7/106* (2013.01); *H04N 7/148* (2013.01); *H01R 13/6675* (2013.01); *H01R 31/02* (2013.01); *H04B 2203/5445* (2013.01); *H04B 2203/5454* (2013.01); *H04B 2203/5483* (2013.01)
USPC ..... 348/14.08; 307/44; 340/575; 361/679.33; 363/146; 439/620.01; 439/651; 604/503; 702/91; 705/14.41

(58) Field of Classification Search
CPC .......................... H01R 31/065; Y10S 439/956
USPC ............ 340/575; 348/14.08; 361/679.1; 439/620.01, 651; 604/503; 702/91; 705/14.41; 307/44; 363/146
See application file for complete search history.

(56) References Cited

U.S. PATENT DOCUMENTS

| | | | | |
|---|---|---|---|---|
| 5,243,510 | A | * | 9/1993 | Cheney, II ................ 363/146 |
| 5,827,092 | A | * | 10/1998 | Minich ..................... 439/620.1 |
| 5,975,958 | A | * | 11/1999 | Weidler ................... 439/620.22 |
| 6,638,113 | B2 | * | 10/2003 | Kajiwara et al. ............ 439/651 |

(Continued)

OTHER PUBLICATIONS

Polycom®, "Polycom® VoiceStation® 300: Crystal-clear conferencing for smaller rooms and desktops," Data Sheet (2013) 2 pages.

(Continued)

*Primary Examiner* — Gerald Gauthier
(74) *Attorney, Agent, or Firm* — Swanson & Bratschun, L.L.C.

(57) ABSTRACT

One embodiment is an enhanced power supply including electronic power supply circuitry within a housing. The enhanced power supply further includes one or more sockets operatively associated with the housing providing for the connection of an external apparatus to the enhanced power supply such that the external apparatus may communicate data or another signal through the connection to an output cable. The output cable may to be connected to a device such that both power and at least one signal will be provided to the device through the output cable. Systems featuring an enhanced power supply and methods of providing power and one or more other signals to a device with a reduced number of cables are also disclosed.

20 Claims, 8 Drawing Sheets

(56) References Cited

U.S. PATENT DOCUMENTS

| | | |
|---|---|---|
| 7,587,289 B1 * | 9/2009 | Sivertsen .................... 702/91 |
| 7,768,388 B2 | 8/2010 | Putterman et al. |
| 8,063,929 B2 | 11/2011 | Kurtz et al. |
| 8,144,182 B2 | 3/2012 | Shoemake et al. |
| 8,366,487 B2 * | 2/2013 | Weng et al. .............. 439/620.01 |
| 2009/0079264 A1 * | 3/2009 | Minami ..................... 307/44 |
| 2011/0035271 A1 * | 2/2011 | Weaver et al. ............. 705/14.41 |
| 2012/0133515 A1 * | 5/2012 | Palshof ..................... 340/575 |
| 2012/0268888 A1 * | 10/2012 | Tian et al. ................. 361/679.33 |
| 2012/0315793 A1 * | 12/2012 | Hermann et al. ......... 439/620.01 |
| 2013/0046280 A1 * | 2/2013 | Martin et al. .............. 604/503 |
| 2013/0265384 A1 * | 10/2013 | Shoemake et al. ......... 348/14.08 |

OTHER PUBLICATIONS

Polycom®, "Polycom® VoiceStation® 300," User Guide (2014), 17 pages.

* cited by examiner

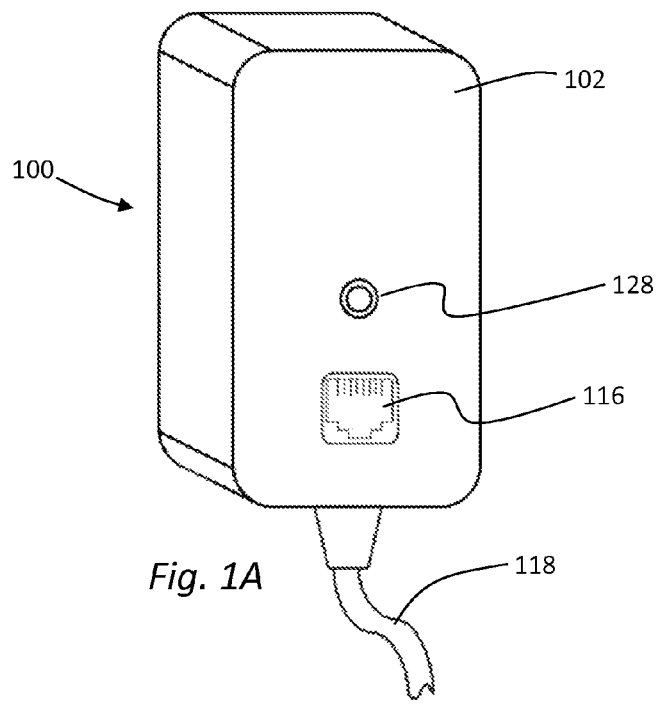
Fig. 1A
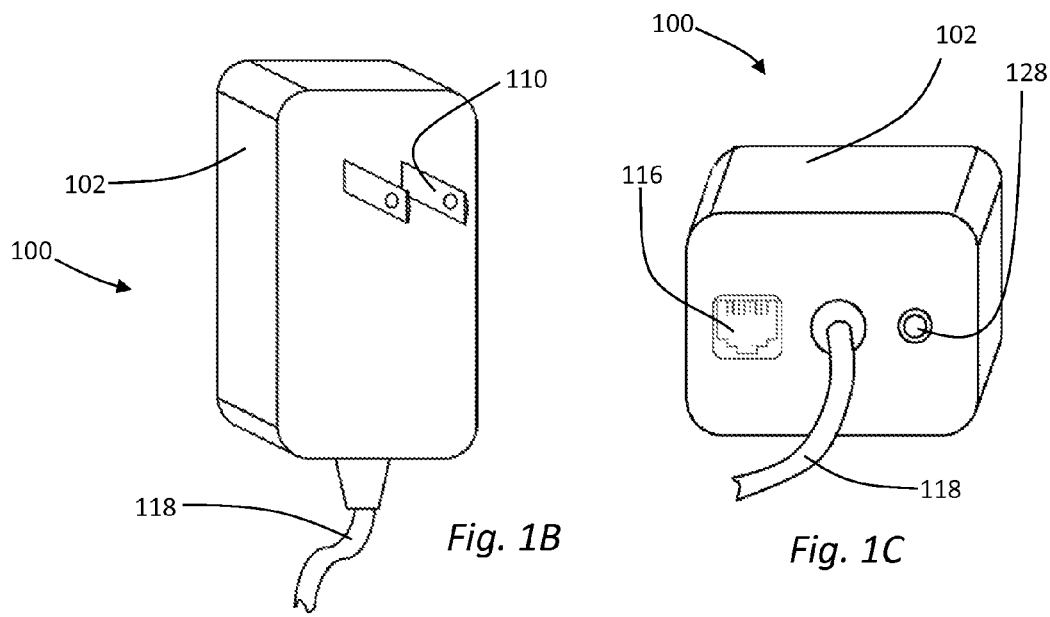
Fig. 1B
Fig. 1C

ENHANCED POWER SUPPLY

CROSS-REFERENCES TO RELATED APPLICATIONS

This application claims the benefit, under 35 U.S.C. §119 (e), of co-pending provisional U.S. Patent Application No. 61/620,90 filed Apr. 5, 2012, by Shoemake et al. and titled "Enhanced Power Supply," which is hereby incorporated by reference, as if set forth in full in this document, for all purposes.

U.S. patent application Ser. No. 12/561,165, filed Sep. 16, 2009 by Shoemake et al. and titled "Real Time Video Communications System" (issued as U.S. Pat. No. 8,144,182) is hereby incorporated by reference, as if set forth in full in this document, for all purposes.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to enhanced power supplies, and more particularly to enhanced power supplies for image and video capture devices.

BACKGROUND

Video calling (also called video conferencing) is a promising technology to allow friends, family and business associates to interact both aurally and visually, even when far apart. Certain solutions have been developed to provide video conferencing technology to consumers. For example, certain solutions are based on a personal computer ("PC") utilizing simple cameras such as web cams and video chat software available from SKYPE and others. While relatively inexpensive, such PC-based solutions have several shortcomings of their own. As an initial matter, the call quality of a video call using such solutions is far from optimal, and the software and hardware required to implement them can be confusing and error-prone.

Other solutions have been developed to more simply provide for high quality video calling. For example, the Biscotti™ device, available from Biscotti, Inc., provides an inexpensive tool to allow video calling using a high-definition television and an Internet connection. Biscotti™ devices are described in U.S. Pat. No. 8,144,182, already incorporated by reference. Other devices providing higher quality or simpler operation than PC/webcam solutions have reached the market as well, including without limitation the TV Cam HD™, available from Logitech, and the TelyHD™, available from Tely Labs, which aim to provide similar functionality.

In use, a video calling device or image capture camera is often placed on top of or near to a television or computer monitor. Thus, it is desirable to implement the video calling or image capture device with an unobtrusive and stylish housing. Proper device functioning requires that power and one or more communications or data signals be electrically communicated to and from the video calling device. For example, certain known devices include separate HDMI in, HDMI out and power in cabling with each of these 3 separate cables being terminated with a standard connector received in an appropriate socket on the back of the device. Other devices include connections for Ethernet, USB or other input and output signals on the back the device which can substantially increase the size of a video calling device. Thus, the unobtrusive and stylish nature of a video calling or image capture device and the ease of implementing a device can be somewhat compromised by the need for multiple cables running from the device to a power supply, a separate set-top box or computer and/or a network device or other apparatus. Hence, there is a need for solutions that reduce the number of power, data or signal cables running to from a video calling or image capture device providing for a video calling or image capture device with reduced size, without reducing desired functionality.

BRIEF SUMMARY

A set of embodiments disclosed herein provides tools and techniques to allow a device, for example a teleconferencing device, to be powered and to communicate with external apparatus utilizing a reduced amount of cabling leading directly to the teleconferencing device and minimizing the number of connectors on the teleconferencing device. In particular, various embodiments disclosed herein feature an enhanced power supply having an output cable connected to a device wherein the output cable supplies power from the power supplied to the device and the output cable provides at least one signal to or from the device through the enhanced power supply to an external apparatus.

In certain embodiments, the enhanced power supply includes a housing and electronic power supply circuitry within the housing. The electronic power supply circuitry provides for input of AC power and also provides for the conversion of the AC input to a DC output. The enhanced power supply also includes a conductive plug in electrical communication with the electronic power supply circuitry providing for the connection of the enhanced power supply to an AC source.

The enhanced power supply further includes at least one data socket operatively associated with the housing. The data socket provides for the connection of an external apparatus to the enhanced power supply such that the external apparatus may communicate data or another signal through the connection to an output cable having a proximal end exiting the housing. The output cable comprises multiple conducting wires within a single jacket. The first subset of conducting wires is connected to the DC output from the electronic power supply circuitry and a second subset of conducting wires is connected to the data socket. The output cable is terminated with a connector at the distal end. The connector allows the output cable to be connected to a device such that both power and at least one signal will be provided to the device through the output cable.

The enhanced power supply may include other sockets associated with the housing which also accept connections to other external apparatus. For example, the enhanced power supply may further comprise at least one audio socket providing for the communication of audio signals through an audio connector. The audio socket can be connected to a third subset of conducting wires within the output cable. In such an embodiment, the output cable may then convey power, data and audio signals to the device.

The enhanced power supply may include many divergent types of data or communication sockets in electrical communication with the output cable and connector. For example, the enhanced power supply may include one or more RJ-45 data sockets, USB data sockets, HDMI sockets were other sockets configured to receive connections to external apparatus providing Ethernet, Internet, audio, visual or other types of signals according to any recognized protocol. The signals at the enhanced power supply are then passed through the appropriate connection to a subset of wires within the output cable and conveyed to the device. Thus, the device may receive power and multiple signals of any type through a minimized number of cables from the enhanced power supply to the device.

The output cable may feature novel shielding, for example the output cable may include a first grounded shield surrounding all of the conducting wires and additional grounded shields surrounding only distinct subsets of conducting wires connected to a data, audio or communications sockets.

An alternative embodiment comprises a system including an enhanced power supply as described above. The enhanced power supply is connected to a device, which may be a teleconferencing device, through one or a minimum number of output cables. At least one output cable provides both power and at least one data signal to the device, with the data signal being passed through the enhanced power supply from an external apparatus. The external apparatus connected to the enhanced power supply may be but is not limited to a microphone, a headset, headphones, a musical instrument, a set-top box or other television communications device, a medical device, a digital camera, an auxiliary video camera a telephone, a cellular telephone, a computer, a computer network gateway or router, an external database, a mainframe or desk computer or other data processing or signal enabled apparatus.

Other embodiments include methods of providing power and at least one signal to a device. Method embodiments feature the use of an enhanced power supply as described herein. The power supply is connected to a source of AC power. A device is connected to the output cable of the enhanced power supply. One or more external apparatuses are also connected to the enhanced power supply through sockets or receptacles associated with the housing of the power supply. When a method is implemented, the device is powered through the output cable with current from the enhanced power supply while a signal is simultaneously transmitted from the external apparatus, through the connection at the enhanced power supply, through the output cable, to the device.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

FIG. 1A is a front perspective view of one embodiment of enhanced power supply.

FIG. 1B is a rear perspective view of the enhanced power supply of FIG. 1.

FIG. 1C is a bottom perspective view of an alternative configuration of enhanced power supply.

DETAILED DESCRIPTION OF CERTAIN EMBODIMENTS

While various aspects and features of certain embodiments have been summarized above, the following detailed description illustrates a few exemplary embodiments in further detail to enable one of skill in the art to practice such embodiments. The described examples are provided for illustrative purposes and are not intended to limit the scope of the invention.

In the following description, for the purposes of explanation, numerous specific details are set forth in order to provide a thorough understanding of the described embodiments. It will be apparent to one skilled in the art, however, that other embodiments of the present may be practiced without some of these specific details. In other instances, certain structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Figure 1D:
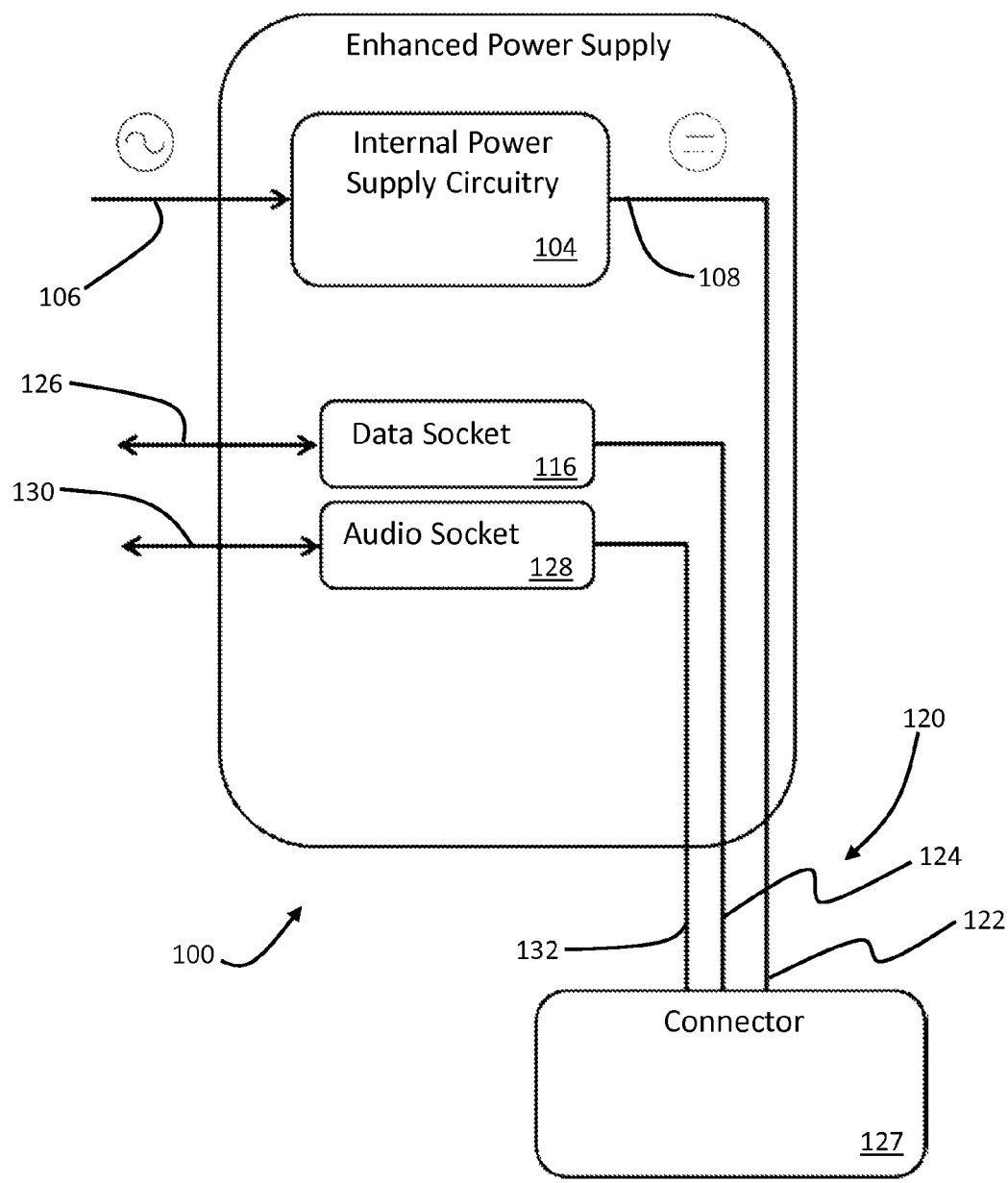
FIG. 1D is schematic representation of the enhanced power supply of FIG. 1A.

One embodiment disclosed herein is an enhanced power supply 100 as shown in FIGS. 1A, 1B and 1C. The enhanced power supply 100 includes a housing 102 which houses or supports various other components. As schematically illustrated in FIG. 1C, the enhanced power supply 100 includes electronic power supply circuitry 104 within the housing 102. The power supply circuitry 104 provides for the conversion of an AC input 106 to a DC output 108. The power supply circuitry 104 may be configured to provide DC output 108 having any desired voltage and current characteristics. Similarly, the power supply circuitry 104 may be configured to receive AC input 106 having any desired voltage characteristics. In certain implementations, multiple input voltages may be accepted or the electrical characteristics of the DC output may be selectable or adjustable.

The power supply circuitry 104 may be implemented with any suitable type of power supply electronics including but not limited to regulated or unregulated linear transformer based circuits, high-frequency switch-mode power supply circuitry, programmable power supply electronics or other power supply circuitry suitable for the conversion of AC to DC.

Figure 2A:
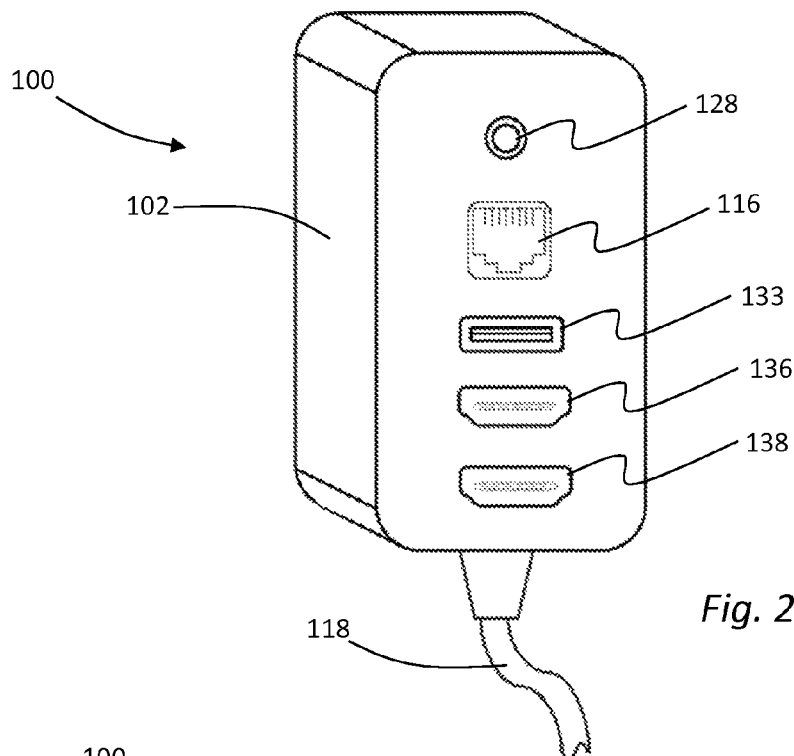
FIG. 2A is a front perspective view of another embodiment of enhanced power supply.

Enhanced power supply 100 also includes a conductive AC power plug or other connector providing for the connection of the AC input section 106 of the power supply circuitry 104 to a source of AC power. For example, as shown in FIG. 1B, a rear perspective view of one embodiment of enhanced power supply 100, the housing 102 may support an AC plug 110 which allows the entire housing of the enhanced power supply to be plugged directly into a typical AC socket. Alternatively, as shown in FIG. 2A, an enhanced power supply 100 may feature a separate AC plug 112 connected to the AC input 106 of the internal power supply circuitry 104 through a power cord 114. The AC plugs 110 illustrated in the figures are representative of a plug configuration such as would be used in North America. Alternative embodiments may be implemented with AC plugs 110 configured for use in other regions.

The enhanced power supply 100 also includes at least one data socket 116 associated with the housing 102. For example, in the FIG. 1A embodiment, one type of data socket, a female RJ-45 connector is attached to, molded into or otherwise associated with the housing 102 of the enhanced power supply 100. Conductive pins, pads or other conductors within the data socket 116 provide for the connection of an external device (or a cable attached to an external device) into an electrical communication with the data socket 116. For example, a Category-5 or similar network cable terminated with a male RJ-45 connector could be connected to the data socket 116 at the enhanced power supply 100 with the other end of the network cable connected to a computer network apparatus such as a router. In this manner, the data socket 116 is placed into electrical communication with the computer network apparatus according to a selected protocol, including but not limited to Ethernet 10/100. Numerous other examples of external devices which could be connected to the data socket 116 are described in detail below.

It is important to note that the socket configuration shown in FIG. 1A or elsewhere in the figures is not limiting. For example, FIG. 1C is a bottom perspective view of an enhanced power supply 100 with the data socket 116 and other elements associated with the bottom of the housing 102. Other socket and power supply housing configurations are within the scope of the present disclosure.

The enhanced power supply 100 also includes an output cable 118. The proximal end of the output cable 118 terminates at or within the housing 102. The output cable 118 comprises a plurality of conducting wires 120 housed within a single cable jacket. The plurality of conducting wires 120 can be grouped into various subsets based upon the proximal connection of one or more of the conducting wires in each subset. For example, in the embodiment of FIG. 1, as best shown in FIG. 1C, a first subset of conducting wires 122 is connected within the housing 102 to the DC output 108 of the power supply circuitry 104. A second subset of conducting wires 124 is connected within the housing 102 to the input pins of the data socket 116. The number of wires in any particular subset identified within the output cable 118 may be selected to achieve specific engineering requirements. For example, the first subset of conducting wires 122 connected to the DC output 108 requires at least two wires, with one wire connected to the positive DC output and the other connected to the negative DC output. As detailed below however, more than two wires may be utilized in the first subset of conducting wires 122 if desired, for example to increase the current carrying capacity of the output cable 118.

As noted above, the proximal ends of the second subset of wires 124 within the output cable 118 are terminated at the data socket 116. Thus, the data socket 116 does not typically convey data to hardware which is operational within the enhanced power supply 100. On the contrary, as shown in FIG. 1C, the data socket 116 serves primarily as a connection point providing for the transmission of a data signal 126 from an external device which is connected to the data socket 116 to a device connected to the distal end of the output cable 118.

Thus, as described in more detail below, one output cable 118 can convey both power and data (or other) signals from the enhanced power supply 100 the device connected to the distal end of the output cable 118.

The data signal 126 may be any type of data signal, provided that the data signal matches the supplied data socket 116. In FIG. 1, the data socket 116 is illustrated as an RJ-45 connector which is suitable for communicating an Ethernet signal as described herein. It is important to note that the data socket 116 could be implemented with an alternative type of connector, a USB connector for example providing for the communication of a USB signal. A data signal 126 may convey data upstream, downstream or bi-directionally.

As noted above, the output cable provides a single pathway for both power and various types of signals to a device such as a video conferencing device. Typically, the output cable 118 is terminated at the distal end with a connector 127. The connector 127 will include multiple electrically conductive terminations of the conducting wires of the output cable 118. The number of terminations included with a connector 127 will typically be equal to or greater than the number of conducting wires included within the output cable 118. The connector 127 may then be selectively attached to a device as detailed below, providing for power and signal communication to and from the device, through the enhanced power supply 100, to and from one or more external devices attached thereto, utilizing only a single cable and connector to carry power and at least one other signal between the enhanced power supply and the device.

The enhanced power supply 100 may include one or more other connectors or sockets similar to the data socket 116 which provide for the communication of additional signals through the enhanced power supply 100 to a device through the output cable 118. For example, an enhanced power supply 100 may include an audio socket 128 which provides for the communication of an audio signal 130 to or from an appropriate apparatus such as a microphone, headset, headphones, musical instrument, computer or other external device, to a device connected to the output cable 118. The audio socket 128 is illustrated in FIG. 1A as a 3.5 mm TRRS audio jack, but the audio socket 128 could alternatively be implemented with any type of jack or connector suitable for conveying an audio signal 130.

The audio socket 128 is connected to the proximal ends of a third subset of conductive wires 132. The third subset of conductive wires 132 is configured to convey an audio signal through the output cable 118 to or from a device. The audio signal 130 may be an analog audio signal or a digital audio signal in any suitable format.

Figure 2B:
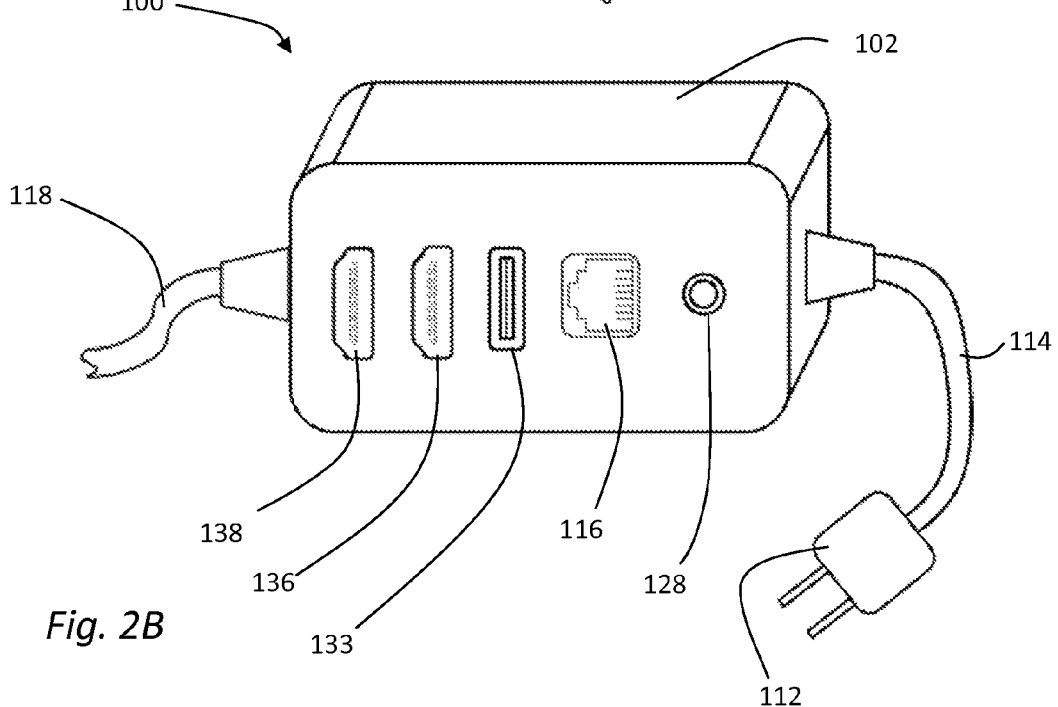
FIG. 2B is a top perspective view of another embodiment of enhanced power supply.
Figure 2C:
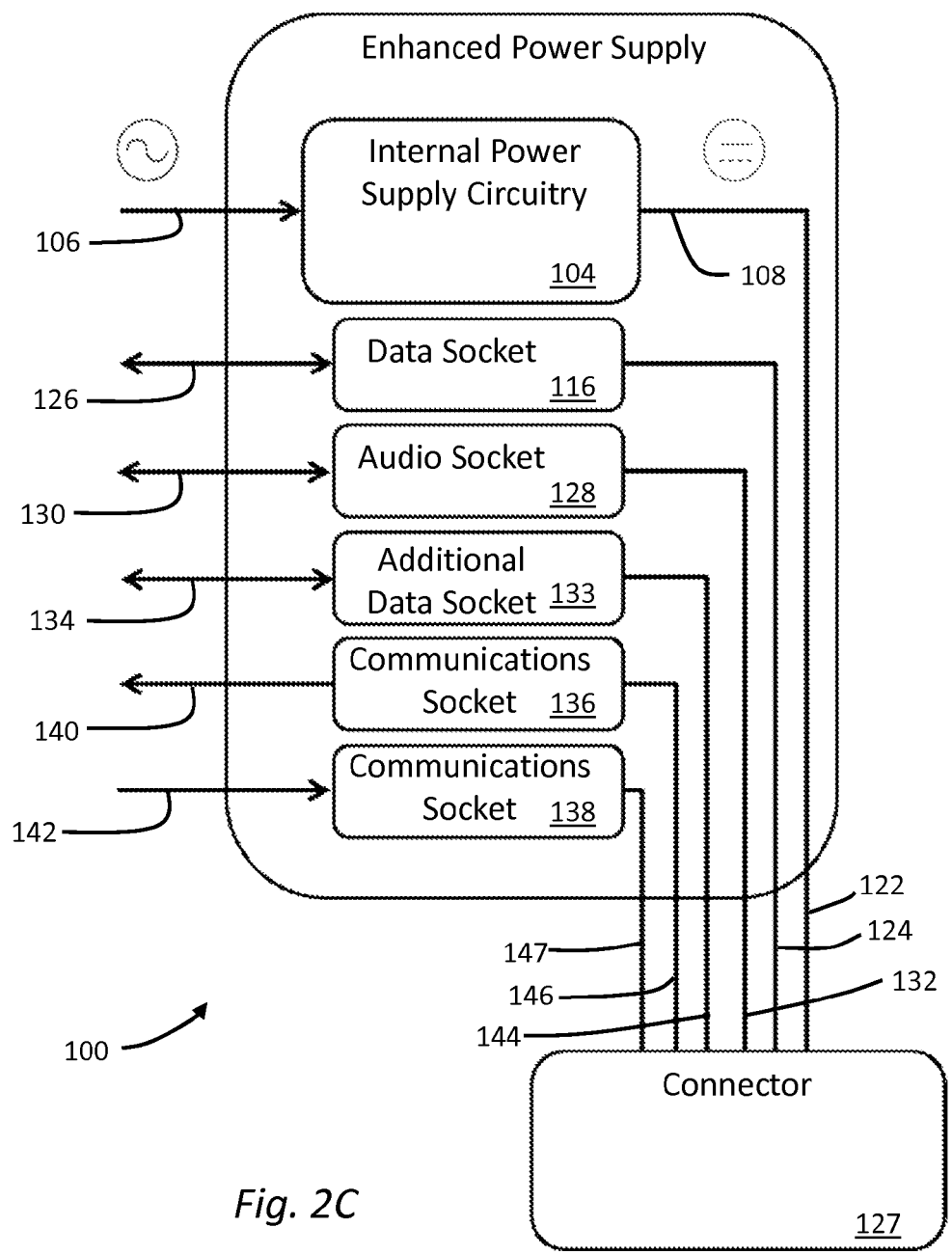
FIG. 2C is schematic representation of the enhanced power supply of FIG. 2A.

As illustrated in FIGS. 2A, 2B and 2C, an enhanced power supply 100 may be implemented with multiple data and/or communications sockets. For example, the enhanced power supply 100 can, in certain embodiments, include one or more additional data sockets 133. Any additional data socket 133 will operate in a manner similar to data socket 116, as described above, to couple and transfer a data signal 134 of a selected type through the socket to or from an external device connected to the data socket 133 and to or from a device connected to the distal end of the output cable 118. The particular second data socket 133 illustrated in FIG. 2 is a female USB connector configured to receive a male USB connector.

Also shown on FIG. 2A and FIG. 2B are two communications sockets 136 and 138. The communications sockets 136, 138 are illustrated as female HDMI connectors. Communication sockets 136, 138 could be implemented however with any type of connector suitable for transmitting audio, visual, audiovisual, data or a combined audio/visual/data signals 140, 142 to and/or from an external device connected to sockets 136 or 138.

Is important to note that an enhanced power supply 100 may be implemented with any suitable number of housing sockets of any desired type. In each instance, the socket will be connected to the proximal ends of a subset of conductive wires which then communicate with the distal connector 127 through the output cable 118.

In many instances, the socket (116, 128, 133, 136, 138 or another socket) will be directly connected to the appropriate subset of conductive wires by soldering crimping or another direct attachment method. In other instances, intervening electronic components may be included to boost, filter or otherwise enhance transmission of a signal to or from an external device through the enhanced power supply 100 to the output cable 118.

Typically, each socket will be connected directly or indirectly to a separate subset of conductive wires. For example, in the embodiment illustrated in FIG. 2C, in addition to the first, second and third subsets of conductive wires, 122, 124 and 132 respectively, the output cable comprises a fourth, fifth and sixth subsets of conductive wires 144, 146 and 147 connected to the second data socket 133 and two communications sockets 136, 138 respectively. Each subset of wires within the output cable will comprise a suitable number of individual wires to properly transmit the applicable signal and any associated control signals.

Figure 3:
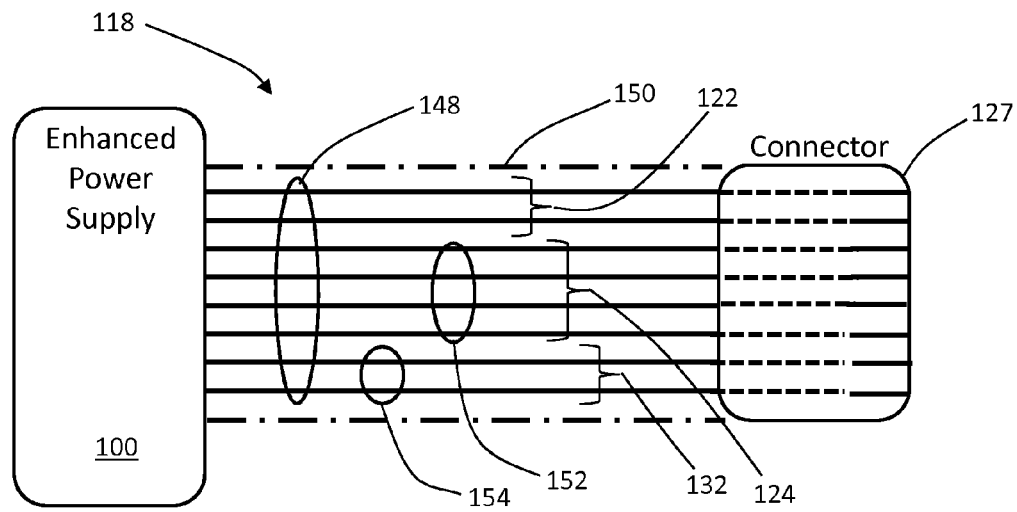
FIG. 3 is a schematic representation of an output cable and associated structures.

As described in detail above, the output cable 118 serves to transmit both power and various signals from the enhanced power supply 100 to a device attached to the connector 127. The inclusion of power and data of various divergent types within the same cable requires unique shielding efforts. In particular, FIG. 3 is a simplified schematic diagram of an output cable 118 extending from an enhanced power supply 100 to a connector 127. In FIG. 3, the wires within the output cable 118 include a first subset of wires 122 configured to convey DC power, a second subset of wires 124 configured to convey data and a third subset of wires 132, configured to convey an audio signal.

The output cable 118 also includes a first grounded shield 148 which may optionally be associated with a drain wire. The first grounded shield 148 surrounds all of the wires within the cable jacket 150. The first grounded shield 148 may be grounded directly or through a drain wire to the power supply circuitry 104, the AC plug 110 or 112 or otherwise. The first grounded shield 148 may be a conductive foil wrapped around all of the wires within the cable jacket 150, a wire mesh, a foil or mesh optionally associated with a drain wire or other known type of shield suitable to provide shielding of the wires within the output cable from external interference.

In addition, the second subset of wires 124, configured to convey data, are wrapped with a second grounded shield 152 which may be associated with the second drain wire. The second grounded shield 152 may be implemented with any combination of foil, mesh, drain wires or other shielding strategies as described above. Similarly, the third subset of wires 132 may be separately wrapped with a third grounded shield 154, optionally grounded through a 3rd drain wire and such also implemented as described above. In this manner the second and third subsets of wires which convey more sensitive audio or data signals are separately shielded from the first subset of wires conveying power and are furthermore shielded from each other.

As noted above, the number of individual wires included in any particular subset may be adjusted to meet particular needs. For example, multiple individual wires may be included in the first subset to carry greater DC current than would be possible with a single positive and a single negative wire alone.

Figure 4:
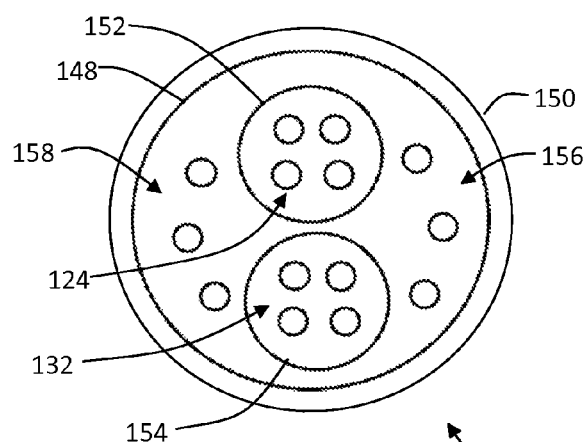
FIG. 4 is a cross section schematic representation of an output cable.

FIG. 4 is a schematic cross-sectional diagram of an output cable 118 which features multiple individual wires in the first subset to increase the DC current carrying capacity of the cable. In particular, the cable 118 of FIG. 4 includes an outer jacket 150 and a first grounded shield 148 surrounding all wires within the cable. The first subset of wires 122, configured to convey DC power, includes three wires 156 connected to the positive DC output 108 and three wires 158 connected to the negative DC output 108. Output cable 118 also includes a second grounded shield 152 surrounding a second subset of wires 124 configured to convey data and a third grounded shield 154 surrounding a third subset of wires 132 configured to convey an audio signal. Embodiments with additional sockets to transmit additional data, communications or other signals may be implemented with additional subsets of wires surrounded by additional grounded shield elements.

Figure 5:
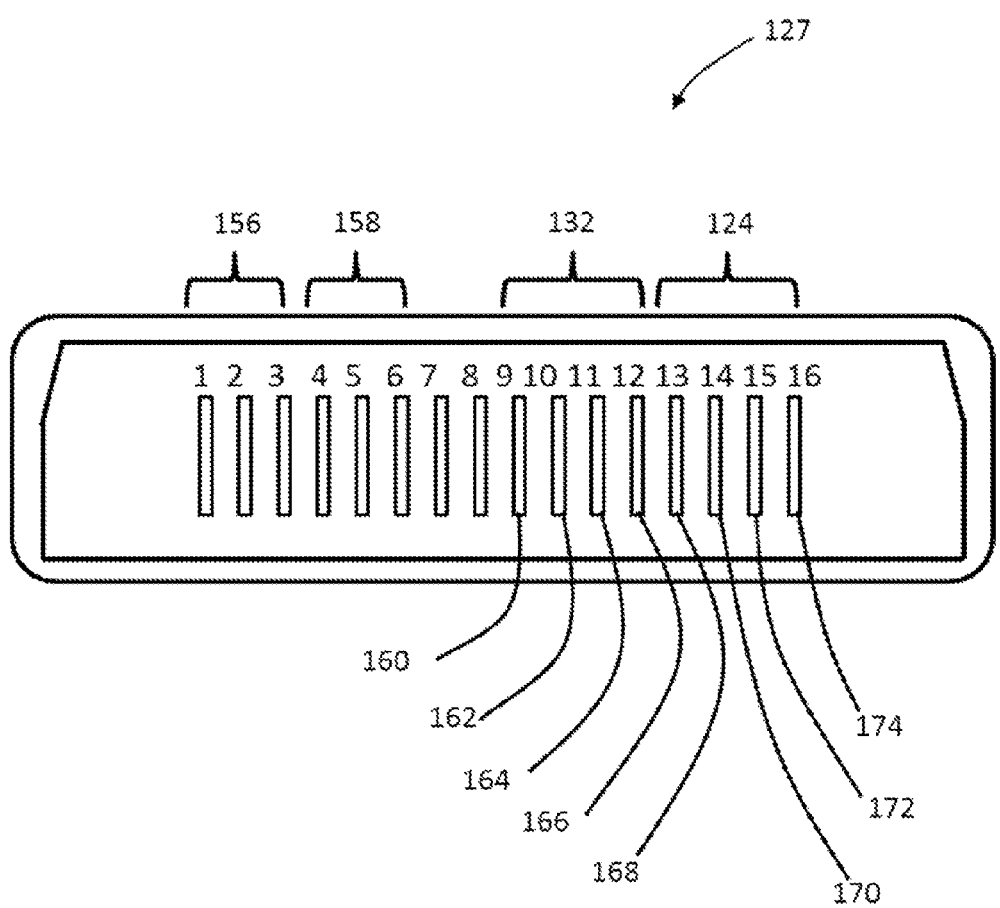
FIG. 5 is a schematic representation of an output connector.

The connector 127 may be configured as desired to properly communicate the DC power and various signals transmitted through the output cable 118 to a connected device. For example, one non-limiting representative connector 127 is schematically illustrated in FIG. 5. In the illustrated embodiment, the pins labeled 1-3 terminate wires 156 connected to the positive DC output. Similarly, the pins labeled 4-5 terminate wires 158 connected to the negative DC output.

Also with respect to FIG. 5, the pins numbered 9-12 terminate the wires in the third subset 132. As noted above these wires carry an audio signal. For example, pin 9 (160) may convey a general purpose input/output signal, pin 10 (162) may convey a microphone detect signal, pin 11 (164) may convey a microphone (+) signal and pin 12 (166) may carry a microphone (−) signal. Alternative configurations of pin-out associated with an audio signal or signal of any type are within the scope of the present disclosure.

In the particular non-limiting embodiment illustrated in FIG. 5, pins 13-16 terminate the wires in the second subset 124 configured to convey a data signal such as an Ethernet 10/100 signal. For example, pins 13-16 may be configured to carry the following portions of a data signal: Pin 13 (168) Tx(+), Pin 14 (170) Tx(−), Pin 15 (172) Rx(+) and Pin 16 (174) Rx(−). As noted above with respect audio signals, the foregoing pin-out is representative, non-limiting and provided as one example only.

Figure 6:
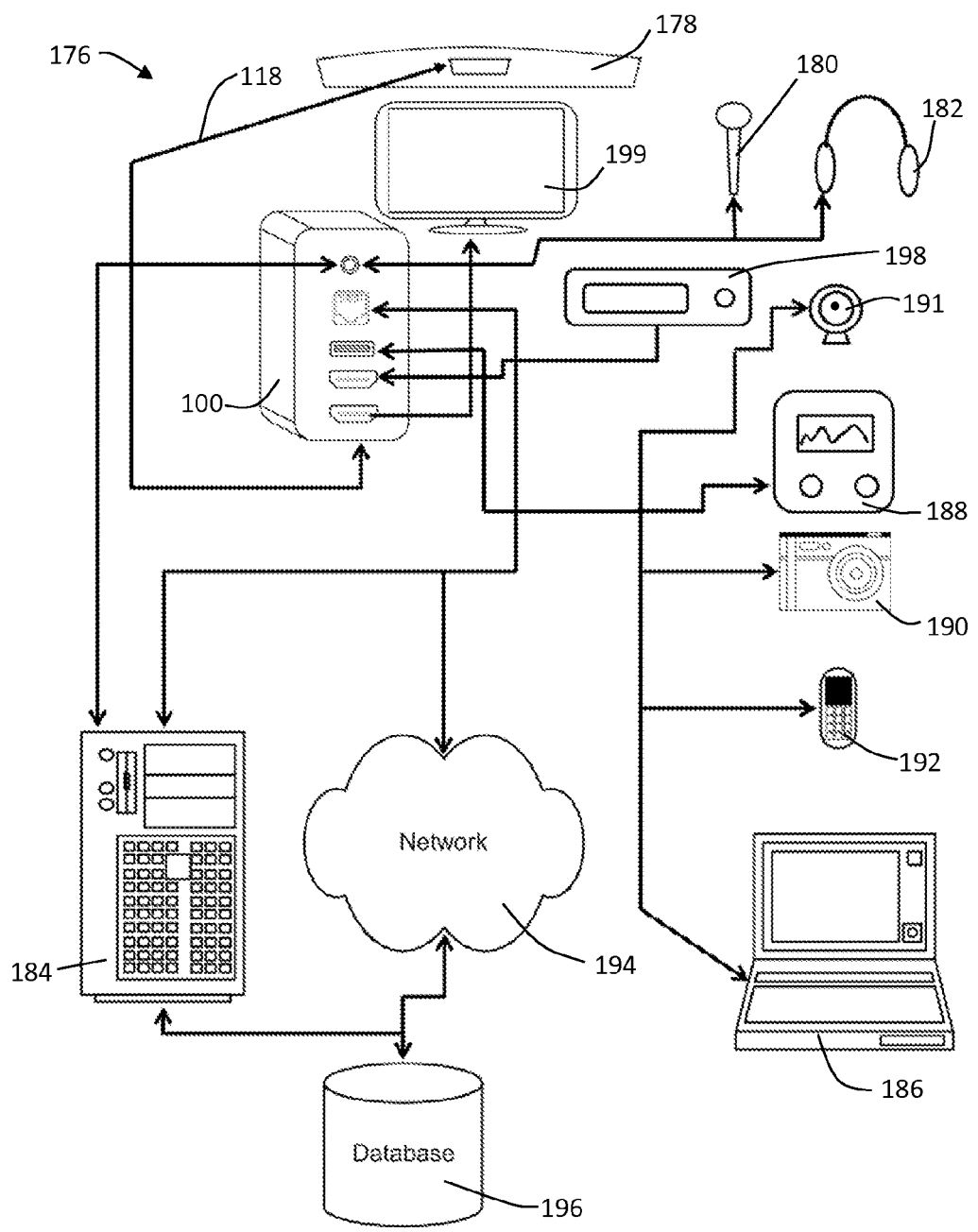
FIG. 6 is a block diagram of a system featuring an enhanced power supply

FIG. 6 schematically illustrates an alternative system 176 embodiment utilizing an enhanced power supply 100 as described above. In all system embodiments, a single output cable 118 conveys power and at least one other signal to a device 178. In some implementations, the single output cable 118 is the only cable connecting the device 178 to other system elements. In a single cable embodiment, all other system elements are attached to the power supply as described herein and communicate with the device through the single output cable 118. Alternatively, the output cable 118 may be the only cable connecting the device 178 to the enhanced power supply 100 with selected ancillary cables connecting the device 178 to other apparatus. For example, according to this alternative embodiment the output cable 118 may convey power and one or more selected signals, Ethernet and or audio for example to the device 178. In addition, selected ancillary cables (not shown on FIG. 6) may connect the device to other apparatus, a set-top box or television for example.

The device may be any type of device which requires input power and one or more signals, for example the device may be a video communications apparatus such as described in U.S.

Pat. No. 8,144,182. The system 176 thus provides for the interconnection of multiple inputs and outputs to the device 178 with only a single cable and connector. This is particularly advantageous when it is desirable that the device 178 present a modern an uncluttered appearance and when it is desirable that the skill and effort required installing and using the device be minimized.

The enhanced power supply 100 of the system 176 includes an audio socket 128, two data sockets 116 and 133 and two communication sockets 140 and 142. As illustrated in FIG. 6, various external apparatus may be connected to the enhanced power supply 100 to communicate appropriate signals to and from the device 178 through the output cable 118. For example, the audio socket 128 may be connected to a microphone 180, headphones 182, a computer 184 or another device utilizing an audio signal, for example a musical instrument, speakers or similar apparatus. The data sockets 116 and 133 may be connected to computers 184 or 186, medical device 188, a camera 190, an external video camera 191, a telephone 192, a computer network 194 through suitable intervening apparatus or a remote or local database 196. The communications sockets 140 and 142 are shown connected to a television set-top box 198 which provides an HDMI or other communications signal. An HDMI output is shown connected to a television 199. In this manner, the system 176 provides for the device 178 connected to multiple external apparatuses and to receive power through the enhanced power supply 100.

Figure 7:
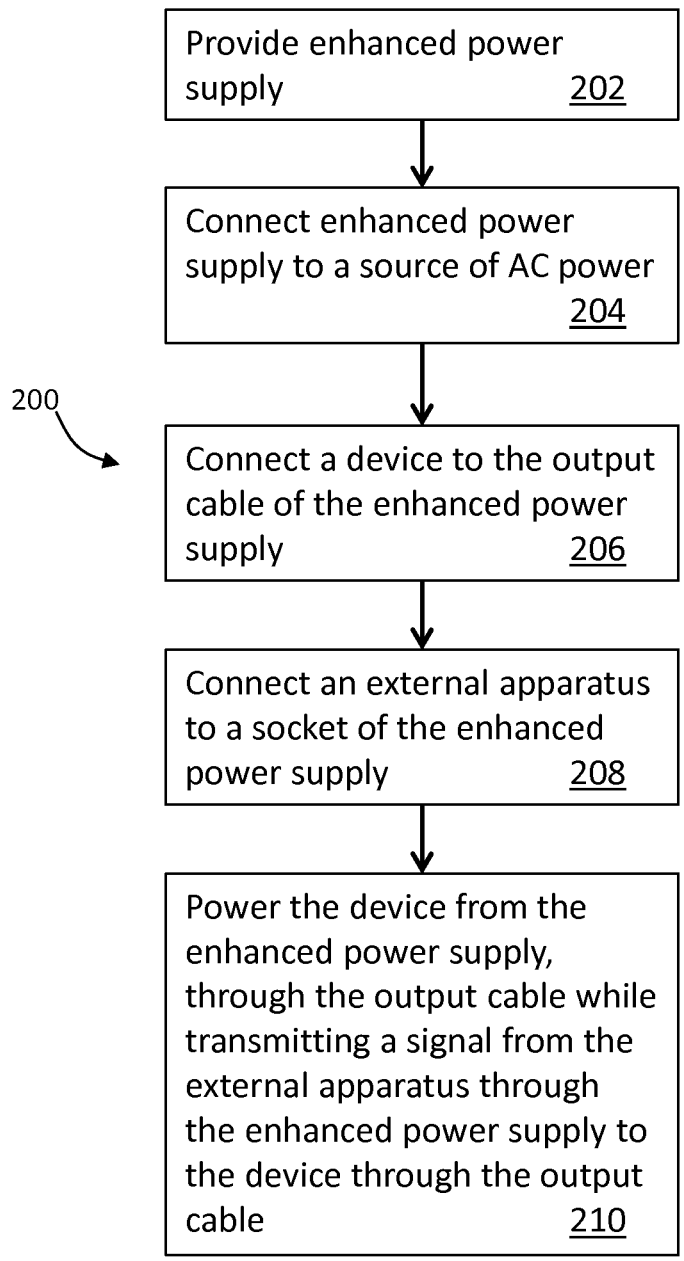
FIG. 7 is a flowchart representation of a disclosed method.

Another embodiment comprises a method of providing power and signals to a device. As illustrated in the flowchart diagram of FIG. 7, the method 200 includes providing an enhanced power supply as described above (step 202). The enhanced power supply may be connected to a source of AC power according to any of the methods noted herein (step 204). The method further includes connecting a device, for example a video communications device, to a connector at the distal end of an output cable of the enhanced power supply (step 206). In addition an external signal producing apparatus is connected to the data socket of the enhanced power supply (step 208). The foregoing connections may be made in any order. Once all connections are made between the enhanced power supply, the AC source, the device, and the external signal producing apparatus, DC power will be supplied to the device through the output cable and connector. In addition a signal will be transmitted from the external signal producing device, through the enhanced power supply and to the device as described in detail above (step 210).

The foregoing method may be implemented with multiple external signal producing apparatuses plugged into data, audio or communication sockets associated with the housing of the enhanced power supply. In this manner, the device (which may be a video conferencing device), can communicate with multiple external apparatuses. For example, the device may have an Ethernet connection through a data socket in the enhanced power supply along with connection to an input microphone or output speaker through one or more audio sockets of the enhanced power supply. In addition, in certain embodiments, communication signals such as HDMI signals may be conveyed between the device and a television set top box or other communications apparatus. Furthermore, in embodiments where the enhanced power supply includes a USB or other suitable data socket, communication between the device and an external apparatus configured to communicate digital information may occur. For example communication may occur between the device and external data storage, a digital camera, a cell phone, a video camera or similar devices.

In instances where the device is a video conferencing camera or system, the disclosed systems and methods may be used to facilitate home healthcare. For example the video conferencing device and system provide for enhanced communication with a physician. Audio and visual communication may be transmitted to and from the device through various communications and data connections simultaneously with the results of a digital blood pressure monitor, digital EKG device, high resolution camera or similar medical apparatus being communicated in real-time to the remote physician.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

While certain features and aspects have been described with respect to exemplary embodiments, one skilled in the art will recognize that numerous modifications are possible. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture but instead can be implemented on any suitable hardware, firmware and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with—or without—certain features for ease of description and to illustrate exemplary aspects of those embodiments, the various components and/or features described herein with respect to a particular embodiment can be substituted, added and/or subtracted from among other described embodiments, unless the context dictates otherwise. Consequently, although several exemplary embodiments are described above, it will be appreciated that the invention is intended to cover all modifications and equivalents within the scope of the following claims.

What is claimed is:

1. An enhanced power supply for a device comprising:
a housing;

electronic power supply circuitry within the housing, the electronic power supply circuitry providing for input of AC current and providing for the conversion of the AC input to a DC output;

a conductive plug in electrical communication with the electronic power supply circuitry providing for connection of the enhanced power supply to an AC source;

at least one data socket operatively associated with the housing, the data socket providing for the communication of data signals through a data connector attached thereto;

an output cable having a proximal end exiting the housing, the output cable comprising multiple conducting wires within a single jacket, wherein a first subset of conducting wires is connected to the DC output from the electronic power supply circuitry and a second subset of conducting wires is connected to the data socket; and a connector operatively associated with a distal end of the output cable wherein the connector comprises electrically conductive terminations of the conducting wires of the output cable connected to the DC output and the connector further comprises electrically conductive terminations of the conducting wires of the output cable connected to the data socket.

2. The enhanced power supply of claim 1 wherein the data socket comprises at least one of a female RJ45 connector and a female USB connector.

3. The enhanced power supply of claim 1 further comprising at least one audio socket operatively associated with the housing, the audio socket providing for the communication of audio signals through an audio connector attached thereto, wherein the output cable further comprises a third subset of conducting wires connected to the audio socket and wherein the connector further comprises electrically conductive terminations of the conducting wires connected to the audio socket.

4. The enhanced power supply of claim 3 wherein the audio socket comprises a 3.5 mm TRRS audio jack.

5. The enhanced power supply of claim 3 further comprising at least two data sockets operatively associated with the housing, with at least one data socket being a female RJ45 connector and at least one other data socket being a female USB connector, wherein the output cable further comprises conducting wires connected to each of the at least two data sockets and the connector further comprises electrically conductive terminations of the conducting wires connected to each data socket.

6. The enhanced power supply of claim 5 further comprising at least one communications socket operatively associated with the housing, the communications socket providing for the communication of audio, visual or data communications signals through a communications connector attached thereto, wherein the output cable further comprises a fourth subset of conducting wires connected to the communications socket and wherein the connector further comprises electrically conductive terminations of the conducting wires of the output cable connected to the communications socket.

7. The enhanced power supply of claim 5 wherein the communications socket comprises a HDMI socket.

8. The enhanced power supply of claim 1 wherein the output cable comprises:

a first grounded shield shielding all of the conducting wires; and a second grounded shield shielding the second subset of conducting wires connected to the data socket.

9. The enhanced power supply of claim 3 wherein the output cable comprises:

a first grounded shield shielding all of the conducting wires;

a second grounded shield shielding the second subset of conducting wires connected to the data socket; and a third grounded shield shielding the third subset of conducting wires connected to the audio socket.

10. The enhanced power supply of claim 6 wherein the output cable comprises:

a first grounded shield shielding all of the conducting wires;

a second grounded shield shielding the second subset of conducting wires connected to the data socket;

a third grounded shield shielding the third subset of conducting wires connected to the audio socket; and a fourth grounded shield shielding the fourth subset of conducting wires connected to the communications socket.

11. The enhanced power supply of claim 3 wherein the output cable comprises at least 16 conductive wires and the connector comprises at least 16 conductive terminations comprising:

at least six terminations connected to wires connected to the DC output;

at least two terminations connected to wires connected to the audio socket; and at least four terminations connected to wires connected to the data socket.

12. A video communications system comprising:

an enhanced power supply comprising:

a housing;

electronic power supply circuitry within the housing, the electronic power supply circuitry providing for input of AC and providing for the conversion of the AC input to a DC output;

a conductive plug in electrical communication with the electronic power supply circuitry providing for connection of the enhanced power supply to an AC source;

at least one data socket operatively associated with the housing, the data socket providing for the communication of data signals through a data connector attached thereto;

an output cable having a proximal end exiting the housing, the output cable comprising multiple conducting wires within a single jacket, wherein a first subset of conducting wires is connected to the DC output from the electronic power supply circuitry and a second subset of conducting wires is connected to the data socket; and a connector operatively associated with a distal end of the output cable wherein the connector comprises electrically conductive terminations of the conducting wires of the output cable connected to the DC output and the connector further comprises electrically conductive terminations of the conducting wires of the output cable connected to the data socket; and a video communications device comprising a socket receiving the connector thereby placing the video communications device into wired communication with the DC output and the data socket.

13. The system of claim 12 further comprising at least one of a computer, a computer network gateway, a telephone, a camera, a video camera, a medical device or digital storage in digital communication with the video communications device through the data socket.

14. The system of claim 12 wherein the enhanced power supply further comprises at least one audio socket operatively associated with the housing, the audio socket providing for the communication of audio signals through an audio connector attached thereto, wherein the output cable further comprises a third subset of conducting wires connected to the audio socket and wherein the connector further comprises electrically conductive terminations of the conducting wires connected to the audio socket.

15. The system of claim 14 further comprising at least one of a computer, a microphone, one or more speakers, a headset, headphones or a musical instrument in wired communication with the video communications device through the audio socket.

16. The system of claim 14 wherein the enhanced power supply further comprises at least one communications socket operatively associated with the housing, the communications socket providing for the communication of audio, visual or data communications signals through a communications connector attached thereto, wherein the output cable further comprises a fourth subset of conducting wires connected to the communications socket and wherein the connector further comprises electrically conductive terminations of the conducting wires of the output cable connected to the communications socket.

17. The system of claim 16 further comprising at least one of a computer, a cable box, a set-top box, a television, a medical device or a telephone in wired communication with the video communications device through the communications socket.

18. A method of providing power and signals to a device comprising:
 providing an enhanced power supply for a device comprising:
  a housing;
  electronic power supply circuitry within the housing, the electronic power supply circuitry providing for input of AC and providing for the conversion of the AC input to a DC output;
  a conductive plug in electrical communication with the electronic power supply circuitry providing for connection of the enhanced power supply to an AC source;
  at least one data socket operatively associated with the housing, the data socket providing for the communication of data signals through a data connector attached thereto;
  an output cable having a proximal end exiting the housing, the output cable comprising multiple conducting wires within a single jacket, wherein a first subset of conducting wires is connected to the DC output from the electronic power supply circuitry and a second subset of conducting wires is connected to the data socket; and
  a connector operatively associated with a distal end of the output cable wherein the connector comprises electrically conductive terminations of the conducting wires of the output cable connected to the DC output and the connector further comprises electrically conductive terminations of the conducting wires of the output cable connected to the data socket;
 providing a device having a socket receiving the connector;
 connecting the enhanced power supply to a source of AC power;
 supplying DC power to the device through the output cable and connector;
 connecting a data processing device to the data connection socket; and
 transmitting data to or from the device through the data socket, output cable and connector.

19. The method of claim 18 further comprising:
 providing an enhanced power supply further comprising at least one audio socket operatively associated with the housing;
 connecting an audio device to the audio socket; and
 transmitting an audio signal to or from the device through the audio socket, output cable and connector.

20. The method of claim 19 further comprising:
 providing an enhanced power supply further comprising at least one communications socket operatively associated with the housing;
 connecting a communications device to the communications socket; and
 transmitting a communications signal to or from the device through the communications socket, output cable and connector.

* * * * *